(12) United States Patent
Yoshioka et al.

(10) Patent No.: US 8,339,033 B2
(45) Date of Patent: Dec. 25, 2012

(54) LIGHT EMITTING ELEMENT AND DISPLAY DEVICE

(75) Inventors: Toshihiro Yoshioka, Kawasaki (JP); Toshiharu Uchida, Yonezawa (JP)

(73) Assignee: Pioneer Corporation, Kanagawa (JP)

( * ) Notice: Subject to any disclaimer, the term of this patent is extended or adjusted under 35 U.S.C. 154(b) by 0 days.

(21) Appl. No.: 13/322,776

(22) PCT Filed: Jun. 11, 2009

(86) PCT No.: PCT/JP2009/002645
§ 371 (c)(1),
(2), (4) Date: Dec. 13, 2011

(87) PCT Pub. No.: WO2010/143231
PCT Pub. Date: Dec. 16, 2010

(65) Prior Publication Data
US 2012/0092872 A1    Apr. 19, 2012

(51) Int. Cl.
*H01J 1/62* (2006.01)
(52) U.S. Cl. ........................... 313/503; 313/110
(58) Field of Classification Search .......... 313/498–512, 313/110–113
See application file for complete search history.

(56) References Cited

U.S. PATENT DOCUMENTS

| | | | |
|---|---|---|---|
| 6,259,423 | B1 | 7/2001 | Tokito et al. |
| 6,406,801 | B1 | 6/2002 | Tokito et al. |
| 6,831,409 | B2 | 12/2004 | Yamada |
| 7,623,199 | B2 | 11/2009 | Domoto |
| 2003/0034938 | A1 | 2/2003 | Yamada |
| 2006/0091380 | A1 | 5/2006 | Yuuki et al. |
| 2007/0069996 | A1 | 3/2007 | Kuba et al. |
| 2007/0076141 | A1 | 4/2007 | Domoto |
| 2007/0252520 | A1 | 11/2007 | Hasegawa |
| 2010/0044728 | A1 | 2/2010 | Domoto |

FOREIGN PATENT DOCUMENTS

| | | |
|---|---|---|
| CN | 1396791 | 2/2003 |
| CN | 1941401 | 4/2007 |
| CN | 1941402 | 4/2007 |
| JP | 09-180883 | 7/1997 |
| JP | 11-67448 | 3/1999 |
| JP | 11-288786 | 10/1999 |
| JP | 2002-367770 | 12/2002 |
| JP | 2006-156966 | 6/2006 |
| JP | 2007-52971 | 3/2007 |
| JP | 2007-103039 | 4/2007 |
| JP | 2007-115679 | 5/2007 |
| JP | 2007-123067 | 5/2007 |
| JP | 2007-123136 | 5/2007 |
| JP | 2007-123137 | 5/2007 |
| JP | 2007-316611 | 12/2007 |
| KR | 10-0872729 | 12/2002 |

OTHER PUBLICATIONS

International Search Report, PCT/JP2009/002645, Jul. 7, 2009.

*Primary Examiner* — Joseph L Williams
(74) *Attorney, Agent, or Firm* — Young & Thompson

(57) ABSTRACT

A light emitting element includes a resonator structure which has a first reflecting member, a second reflecting member, and a light emission layer placed between the first reflecting member and the second reflecting member, and part of light resonated between the first reflecting member and the second reflecting member is transmitted through the first reflecting member or the second reflecting member in the resonator structure. A wavelength at which a resonator output spectrum from the resonator structure has a maximum value is located between a wavelength at which an inner light emission spectrum of the light emission layer has a maximum value and a wavelength at which relative luminous efficiency has a maximum value.

10 Claims, 9 Drawing Sheets

LIGHT EMITTING ELEMENT AND DISPLAY DEVICE

TECHNICAL FIELD

The present invention relates to a light emitting element and a display apparatus.

BACKGROUND ART

Electroluminescence (EL) elements utilizing a substance which emits light by itself through an EL phenomenon when a voltage is applied thereto are known as a type of light emitting element which forms a display apparatus such as a display device and an illumination apparatus. The EL element is a light emitting element of thin film shape in which a light emission layer made from an organic material or an inorganic material is formed between an upper electrode and a lower electrode, and has a structure in which light emission is caused by applying a voltage to the light emission layer with the upper electrode and the lower electrode.

In recent years, development work has been underway on light emitting elements having a resonator structure (a so-called microcavity structure) in which one of the upper electrode and the lower electrode is formed of a total reflection mirror and the other is formed of a semi-transmitting mirror allowing transmission of some of wavelengths, thereby resonating light emitted by the light emission layer (see, for example, Patent Documents 1 and 2).

Patent Document 1 has disclosed a light emitting element in which the peak wavelength of an inner light emission spectrum is shifted from the peak wavelength of a multiple interference spectrum in a resonance portion to reduce dependence of white color on viewing angle. The reduction of the dependence of white color on viewing angle is realized by shifting the peak wavelength of the multiple interference spectrum of a red color (R) toward longer wavelengths (+10 nm), the peak wavelength of the multiple interference spectrum of a green color (G) toward longer wavelengths (+4 nm), and the peak wavelength of the multiple interference spectrum of a blue color (B) toward shorter wavelengths (−10 nm).

Patent Document 2 has disclosed a light emitting element in which the peak wavelength of an inner light emission spectrum is shifted from the peak wavelength of a multiple interference spectrum in a resonance portion to reduce dependence on viewing angle. However, unlike Patent Document 1, the peak wavelengths of the multiple interference spectra of a red color (R) and a blue color (B) are matched to the peak wavelength of the inner light emission spectrum.

The techniques disclosed in Patent Documents 1 and 2 may be effective in display apparatuses, for example a large display, which require the characteristics of wide viewing angle. However, unacceptable nonuniformity of luminance in a front direction may occur in small displays for personal use, for example mobile terminals, personal computers, and car navigation systems.

Specifically, when the resonator structure is used, its filter characteristics and high directivity of light emission output increase the luminance in the front direction. Display apparatuses which do not require the characteristics of wide viewing angle, for example ones for personal use, take advantage of the directivity and thus need reduced nonuniformity of luminance in the front direction as compared with televisions and the like which require a wide viewing angle. However, the thin-film light emitting element of the resonator structure has filter characteristics which are sensitive to an intermirror distance (resonator optical path length), and if nonuniformity occurs in the resonator optical path length due to manufacture errors during the manufacture process, color coordinates (color purity) and luminance variations in the front direction may be unacceptable.

PRIOR ART DOCUMENTS

Patent Documents

[Patent Document 1] Japanese Patent Laid-Open No. 2002-367770
[Patent Document 2] Japanese Patent Laid-Open No. 2007-316611

DISCLOSURE OF THE INVENTION

Problems to be Solved by the Invention

Problems to be solved by the present invention include the abovementioned one, by way of example. It is thus an object of the present invention to provide a technique capable of suppressing luminance variations in a light emitting element having a resonator structure and a display apparatus even when a film thickness deviates from a design value to increase or decrease a resonator optical path length, by way of example.

Means for Solving the Problems

A light emitting element according to the present invention, as descried in claim 1, is characterized by including a resonator structure which has a first reflecting member, a second reflecting member, and a light emission layer placed between the first reflecting member and the second reflecting member, part of light resonated between the first reflecting member and the second reflecting member being transmitted through the first reflecting member or the second reflecting member in the resonator structure, wherein a wavelength at which a resonator output spectrum from the resonator structure has a maximum value is located between a wavelength at which an inner light emission spectrum of the light emission layer has a maximum value and a wavelength at which relative luminous efficiency has a maximum value.

A display apparatus according to the present invention, as descried in claim 10, is characterized by including a number of resonator structures, each of the resonator structures having a first reflecting member, a second reflecting member, and a light emission layer placed between the first reflecting member and the second reflecting member, part of light resonated between the first reflecting member and the second reflecting member being transmitted through the first reflecting member or the second reflecting member in the resonator structure, wherein a wavelength at which a resonator output spectrum from the resonator structure has a maximum value is located between a wavelength at which an inner light emission spectrum of the light emission layer has a maximum value and a wavelength at which relative luminous efficiency has a maximum value.

DESCRIPTION OF REFERENCE NUMERALS

1 SUBSTRATE
2 ANODE
3 ORGANIC LAYER
31 HOLE INJECTION LAYER
32 HOLE TRANSPORT LAYER
33 LIGHT EMISSION LAYER
34 ELECTRON TRANSPORT LAYER
4 CATHODE
5 DIVISION WALL PORTION

BEST MODE FOR CARRYING OUT THE INVENTION

A light emitting element and a display apparatus according to preferred embodiments of the present invention will hereinafter be described in detail with reference to the accompanying drawings. In the following, description is made about a display apparatus having light emitting elements which emit light in a red color (R), a green color (G), and a blue color (B), respectively, by way of example. However, the technical scope of the present invention is not interpreted limitedly by the embodiments described below.

Embodiment 1

Figure 1:
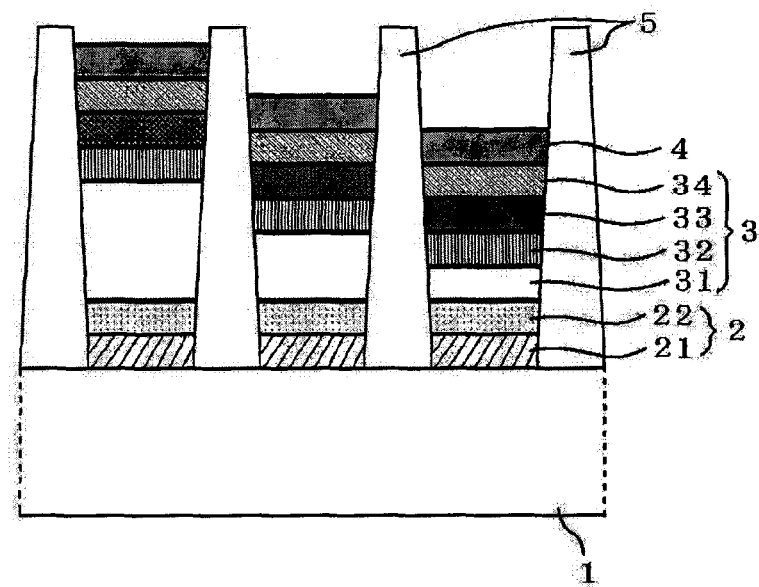
FIG. 1 A longitudinal section view of light emitting elements according to preferred Embodiment 1 of the present invention.
Figure 2:
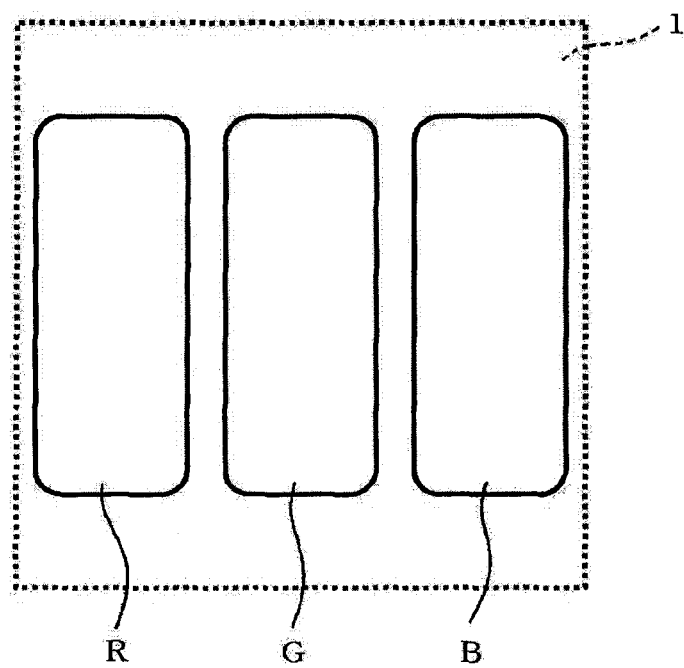
FIG. 2 A plan view of the light emitting elements according to preferred Embodiment 1 of the present invention.

FIG. 1 and FIG. 2 show an example in which an RGB unit is formed by placing three light emitting elements (R, G, B) which emit light of a red color (R), a green color (G), and a blue color (B) on a common substrate 1. FIG. 1 is a longitudinal section view of the light emitting elements (R, G, B) and FIG. 2 is a plan view thereof. The actual display apparatus has a configuration in which a number of light emitting elements (R, G, B) are arranged on the substrate 1 to form a display region and passive driving is performed by a driving circuit, not shown, placed outside the display region, or active driving is performed by a driving circuit placed for each of the elements.

As shown in FIG. 1, the light emitting elements (R, G, B) according to the present embodiment have a so-called top emission structure in which an anode 2 serving as a first reflecting member, an organic layer 3, and a cathode 4 serving as a second reflecting member are stacked on the substrate and emitted light is taken from the deposited film surface side. The light emitting elements for R, G, B are separated by a division wall portion 5 referred to as a bank. An organic layer or an inorganic layer such as a seal film may be additionally placed on the cathode 4. In addition, a film or a substrate for preventing reflection of external light may be further placed, although not shown.

The anode 2 has a two-layer structure of a reflecting electrode 21 and a transparent electrode 22. A material having a high work function is used as a material of the anode 2 that is in contact with a hole injection layer 31. Specifically, a metal such as Al, Cr, Mo, Ni, Pt, Au, and Ag, or an alloy or an intermetallic compound containing any of them can be used as a material of the reflecting electrode 21. The reflecting electrode has a thickness of 100 nm, for example. The reflecting electrode 21 desirably has a high reflectance, for example an average reflectance of 80% or higher for light with wavelengths of 400 to 700 nm. As a material of the transparent electrode 22, it is possible to use a metal oxide such as ITO (Indium Tin Oxide) and IZO (Indium Zinc Oxide), by way of example. The transparent electrode 22 has a thickness of 75 nm, for example. Although omitted in FIG. 1 and FIG. 2, a lead electrode (wiring electrode) is connected to the anode 2. The anode 2 may have a single-layer structure of the reflecting electrode 21.

The organic layer 3 may include some of the layers formed of an inorganic material. The organic layer 3 may be divided into more layers or may be formed of a reduced number of stacked layers such that a single layer has functions of a plurality of layers. The organic layer 3 shown in FIG. 1 has a multilayer structure in which the hole injection layer 31, a hole transport layer 32, a light emission layer 33, and an electron transport layer 34 are stacked in order from the side of the anode 2. While it is essential only that the organic layer 3 should have at least the light emission layer 33, it is preferable that the hole injection layer 31, the hole transport layer 32, the electron transport layer 34 and the like are placed to promote the electroluminescence phenomenon efficiently.

When the resonance structure is used, each of the light emitting elements for R, G, B has a preferable resonator optical path length. In the structure of FIG. 1, the distance between a reflecting surface of the reflecting electrode 21 and a reflecting surface of the cathode 4 corresponds to the resonator optical path length. By way of example, a stacked film thickness for providing the preferable resonator optical path length of the red color (R) is 300 nm, a stacked film thickness for providing the preferable resonator optical path length of the green color (G) is 235 nm, and a stacked film thickness for providing the preferable resonator optical path length of the blue color (B) is 200 nm. These resonator optical path lengths are adjusted, for example by the film thickness of the organic layer 3. However, as described above, it is difficult to prevent any deviation of the film thickness from a design value completely in the manufacture process. Especially when the organic layer 3 is deposited through an application method, the control of the film thickness is difficult. For example, when an inkjet method is used for the deposition, nonuniformity of 5% or more may occur in the film thickness among elements.

In the structure shown in FIG. 1, the resonator optical path length is adjusted by changing the thickness of the hole injection layer 31, by way of example. Specifically, the thickness (design value) of the hole injection layer 31 for the red color (R) is 125 nm, for example, the thickness (design value) of the hole injection layer 31 for the green color (G) is 65 nm, for example, and the thickness (design value) of the hole injection layer 31 for the blue color (B) is 20 nm, for example. The hole transport layers 32, the light emission layers 33, and the electron transport layers 34 are provided to have the same thicknesses among the resonator structures for R, G, B. The thickness (design value) of the hole transport layer 32 is 30 nm, for example, the thickness (design value) of the light emission layer 33 is 30 nm, for example, and the thickness (design value) of the electron transport layer 34 is 40 nm, for example.

Each of the hole injection layer 31 and the hole transport layer 32 may be formed of a material having an excellent hole transport property. Examples of usable organic materials include a phthalocyanine compound such as copper phthalocyanine (CuPc), starburst type amine such as m-MTDATA, a multimer of benzidine type amine, aromatic tertiary amine such as 4,4'-bis[N-(1-naphtyl)-N-phenylamino]-biphenyl (NPB) and N-phenyl-p-phenylenediamine (PPD), a stilbene compound such as 4-(di-P-tolylamino)-4'-[4-(di-P-tolylamino)styryl]stylbenzene, a triazole derivative, a styrylamine compound, and a fullerene such as buckyball and $C_{60}$. It is also possible to use a material of a polymer dispersed type provided by dispersing a low-molecular material in a high-molecular material such as polycarbonate. However, the material of the layers 31 and 32 is not limited thereto.

For the light emission layer 33, it is possible to use a material producing the electroluminescence phenomenon for the red color (R), the green color (G), and the blue color (B). Examples of usable materials of the light emission layer 33 include a fluorescent organic metal compound such as (8-hydroxyquinolinate)aluminum complex ($Alq_3$), a aromatic dimethylidine compound such as 4,4'-bis(2,2'-diphenylvinyl)-biphenyl (DPVBi), a styrylbenzene compound such as 1,4-bis(2-methylstyryl)benzene, a triazole derivative such as 3-(4-biphenyl)-4-phenyl-5-t-butylphenyl-1,2,4-triazole (TAZ), a anthraquinone derivative, a fluorescent organic material such as a fluonorene derivative, a polymer material of polyparaphenylene vinylene (PPV) base, polyfluorene base, and polyvinylcarbazole (PVK) base, and a phosphorescent organic material such as a platinum complex and an iridium complex. However, the material of the layer 33 is not limited thereto. In addition, the organic material is not essential, and an inorganic material producing the electroluminescence phenomenon may be used.

The electron transport layer 34 may be formed of a material having an excellent electron transport property. Examples of usable materials include an organic material such as a silacyclopentadiene (silole) derivative such as PyPySPyPy, a nitro-substituted fluorenone derivative, and an anthraquinodimethane derivative, a metal complex of a 8-quinolinole derivative such as tris(8-hydroxyquinolinate)aluminum ($Alq_3$), metal phthalocyanine, a triazole-based compound such as 3-(4-biphenyl)-5-(4-t-butylphenyl)-4-phenyl-1,2,4-triazole (TAZ), an oxadiazole-based compound such as 2-(4-biphenylyl)-5-(4-t-butyl)-1,3,4-oxadiazole (PBD), and a fullerene such as buckyball, $C_{60}$, and carbon nanotube. However, the material of the layer 34 is not limited thereto.

As a material of the cathode 4, it is possible to use a material which has a low work function in the region in contact with the electron transport layer 34 and has a small loss in reflection and transmission in the whole cathode. Specifically, it is possible to use a single layer or a stacked layer of metal such as Al, Mg, Ag, Au, Ca, and Li or a compound of any of them or an alloy containing any of them as the material of the cathode 4. A thin layer of lithium fluoride or lithium oxide may be formed in the region in contact with the electron transport layer 34 to control the electron injection property. The thickness of the cathode 4 is 10 nm, for example. As described above, the present embodiment has the top emission structure in which light is output from the deposited film surface side or the cathode side. Thus, the cathode 4 is a semi-transmitting electrode which has an average value of 20% or higher of transmittance for light with wavelengths of 400 to 700 nm, by way of example. The transmittance can be adjusted, for example by the film thickness of the electrode. Although omitted in FIG. 1 and FIG. 2, a lead electrode (wiring electrode) is connected to the cathode 4.

For placing the seal film on the cathode 4, the film may be formed, for example, of a transparent inorganic material having a low transmission rate of water vapor or oxygen. Examples of usable materials of the seal film include silicon nitride (SiNx), silicon oxynitride (SiOxNy), aluminum oxide (AlOx), and aluminum nitride (AlNx).

As a material of the division wall portion 5 referred to as the bank, a photosensitive resin containing a fluorine component can be used, for example. Since the fluorine component contained can provide a liquid-repellent property to a liquid material, a liquid flow (so-called overlap) can be suppressed when the application method is used for the deposition. In addition, the division wall portion 5 is preferably made from a material having a light shielding property.

The light emitting elements for the blue color (B) and the red color (R) easily produce unacceptable luminance variations in a front direction due to an increase and a decrease in luminous efficiency resulting from a shift of a peak wavelength as compared with the light emitting element for the green color (G). Of the two, the blue color (B) suffers from larger luminance variations associated with variations in resonator optical path length than those for the red color (R). Thus, in the present embodiment, luminance variations in the front direction are suppressed particularly in the light emitting element for the blue color (B) even when the film thickness deviates from a design value in the manufacture process to increase or decrease the resonator optical path length. To perform this, an inner light emission spectrum, a relative luminous efficiency spectrum, and a resonator output spectrum are set to satisfy the following conditions. The inner light emission spectrum corresponds to the photoluminescence (PL) spectrum of the light emitting material. The resonator output spectrum corresponds to the spectrum of light transmitted through the resonator structure. On the other hand, the wavelength at which the relative luminous efficiency spectrum has a maximum value is 555 nm for standard photopic vision.

Figure 3:
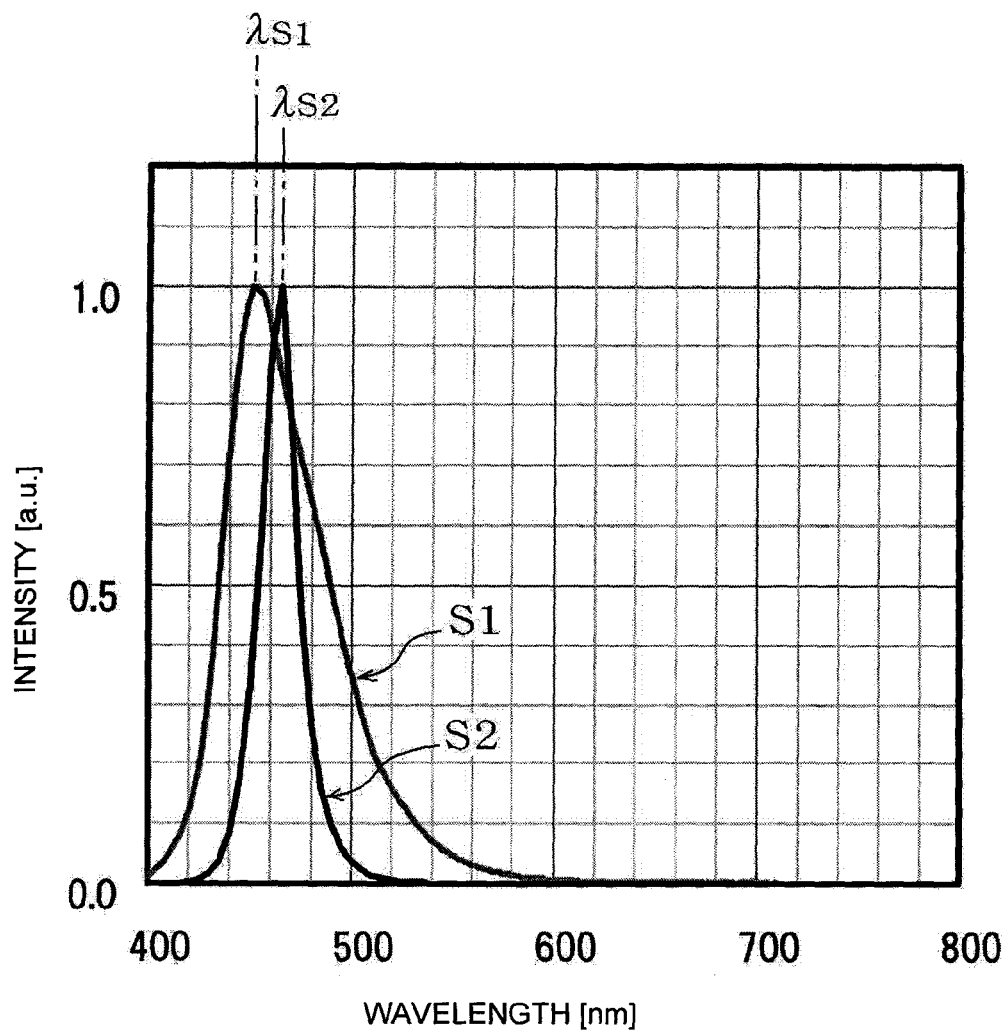
FIG. 3 A diagram showing optical spectra when a blue color (B) is particularly used.

Specifically, as shown in FIG. 3, the peak wavelength ($\lambda S2$) of the resonator output spectrum S2 is located between the peak wavelength ($\lambda S1$) of the inner light emission spectrum and the peak wavelength (that is, 555 nm) of the relative luminous efficiency spectrum which is known and thus not shown. For convenience of description, the wavelength where light emission intensity is at the maximum may be referred to as the peak wavelength.

As described above, since the stacked film thickness (design value) of the organic layer 3 is determined to provide the resonator optical path length preferable for the blue color (B) in the structure shown in FIG. 1, the peak wavelength (target value) of the resonator output spectrum S2 is accordingly determined. For example, when the resonator optical path length (design value) is set to 200 nm, the peak wavelength (target value) is 470 nm. The peak wavelength of the relative luminous efficiency spectrum is 555 nm for standard photopic vision. Thus, in the present embodiment, a light emitting material which provides the inner light emission spectrum S1 so as to establish the above-mentioned positional relationship between the spectra is selected from the light emitting materials described above as examples, and the selected light emitting material is used to form the light emission layer 33. In other words, it is possible to select and use the light emission layer which provides the desired spectrum from the light emitting materials described above as examples. It is preferable to use the light emitting material having the peak wavelength of the inner light emission spectrum S1 that falls within the range of 450 nm to 480 nm and having the peak wavelength of the resonator output spectrum S2 that is located toward longer wavelengths relative to the peak wavelength of the inner light emission spectrum S1. In addition, the slope shape of the inner light emission spectrum S1 toward longer wavelengths preferably has a shape generally proportional to the inverse of the slope of the relative luminous efficiency spectrum toward shorter wavelengths. Especially for the blue color (B), it is preferable that the edge of the inner light emission spectrum S1 toward longer wavelengths is steepened and that the peak wavelength of the resonator output spectrum S2 is located in the steep region.

Figure 4:
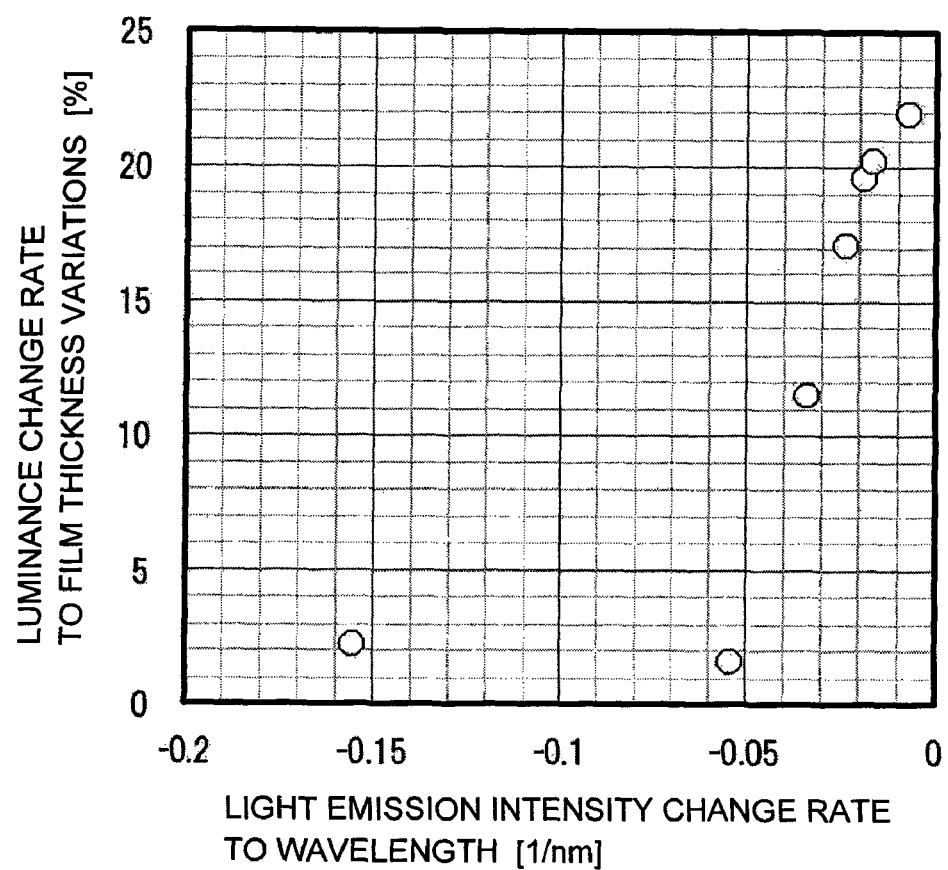
FIG. 4 A diagram showing the relationship between a change rate $R_E$ of light emission intensity and a luminance change rate when the blue color (B) is particularly used.
Figure 5:
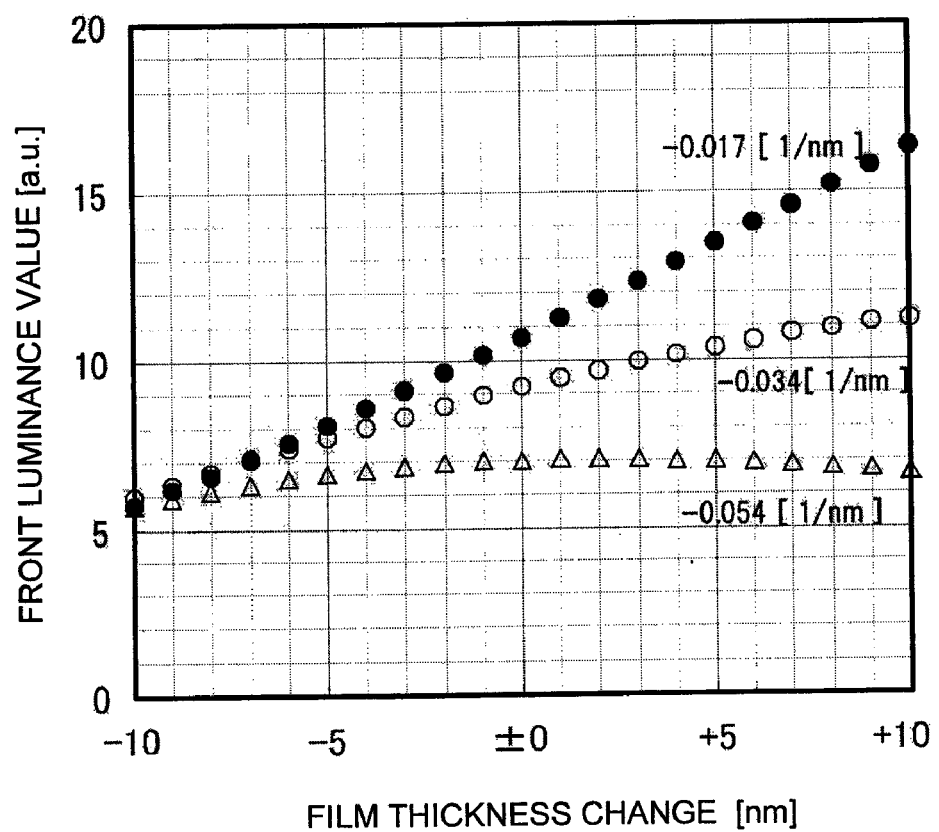
FIG. 5 A diagram showing the relationship between a film thickness change and a front luminance value when the blue color (B) is particularly used.

In a more preferable example, as shown in FIG. 4 and FIG. 5, a change rate $R_E$ of light emission intensity of the inner light emission spectrum S1 at the peak wavelength ($\lambda$S2) of the resonator output spectrum S2 is set to −0.03 [1/nm] or lower, preferably −0.05 [1/nm] or lower. FIG. 4 shows the results of simulation of the relationship between the change rate $R_E$ of the light emission intensity when the peak wavelength $\lambda$S2 is 470 nm (design value) and a luminance change rate RL (%) to film thickness variations. FIG. 5 shows the results of simulation of changes in front luminance when the film thickness of the light emission layer 33 increases or decreases near the design value, for example. FIG. 5 shows the simulation results when the change rates $R_E$ in the plotted points of FIG. 4 are −0.017 [1/nm], −0.034 [1/nm], and −0.054 [1/nm], by way of example.

The change rate $R_E$ of the light emission intensity is provided by dividing the gradient of the inner light emission spectrum S1 at the peak wavelength ($\lambda$S2) of the resonator output spectrum S2 by the light emission intensity at the wavelength ($\lambda$S2), and is calculated with a calculation expression $R_E$ [1/nm]=[dE($\lambda$S2)/d$\lambda$]/E($\lambda$S2). The luminance change rate RL (%) is the change rate in luminance to film thickness variations of d0±2 nm when the optimal film thickness satisfying the NTSC color purity is assumed to be d0. More specifically, the luminance change rate RL (%) is the value calculated as follows: the luminance change rate RL [%]=[difference from maximum to minimum luminance at d0±2 nm]/[luminance at d0]×100. As seen in FIG. 4 and FIG. 5, the change rate $R_E$ of the light emission intensity in the light emitting element for the blue color (B) is preferably set to −0.03 [1/nm] or lower at which the effect of suppression of luminance variations starts to appear, and more preferably, −0.05 [1/nm] or lower at which luminance variations can be suppressed significantly.

Figure 6:
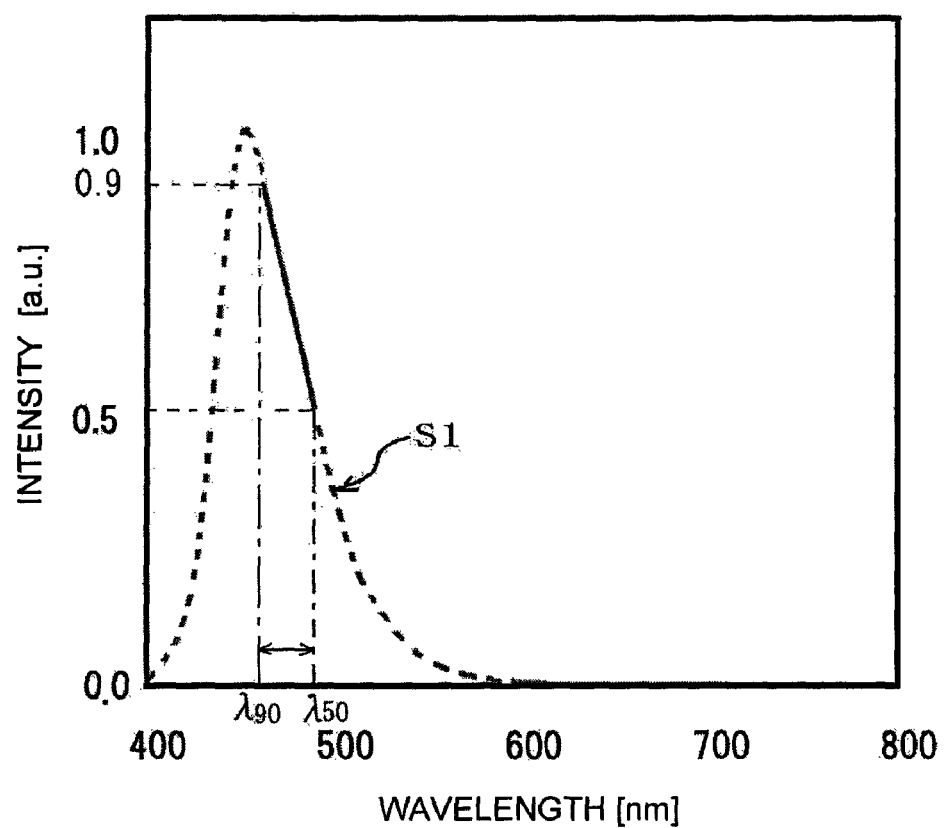
FIG. 6 A diagram showing an optical spectrum when the blue color (B) is particularly used.

While the change rate $R_E$ of the light emission intensity of the inner light emission spectrum S1 at the peak wavelength $\lambda$S2 of the resonator output spectrum S2 preferably satisfies the abovementioned condition in the present embodiment, settings may be made to satisfy conditions shown in FIG. 6 in addition to the change rate $R_E$ satisfying the abovementioned condition or instead of the change rate $R_E$ satisfying the abovementioned condition. Specifically, the peak wavelength $\lambda$S2 of the resonator output spectrum S2 is set to be located within the wavelengths ($\lambda$90 to $\lambda$50) corresponding to the range (the range indicated by a solid line in FIG. 6) of 90% to 50% of the highest value of the light emission intensity of the inner light emission spectrum S1 at the edge of the inner light emission spectrum S1 toward longer wavelengths.

To satisfy the various conditions described above, the abovementioned relationship may be achieved not only by performing the control through the selection of the light emitting material but also by adjusting the peak wavelength (target value) of the resonator output spectrum S2 within a range in which acceptable color purity is provided, for example. The adjustment of the peak wavelength (target value) of the resonator output spectrum S2 can be performed by adjusting the film thickness (design value) of the organic layer 3. In addition, both of the selection of the light emitting material and the adjustment of the film thickness (design value) of the organic layer 3 may be performed to satisfy the abovementioned conditions.

The resonator structure can be designed with a relatively large margin for color purity. On the other hand, the luminances of the light emitting elements for the blue (B) color and the red (R) color may vary unacceptably due to a shift of the peak wavelength of the resonator output spectrum S2. For example, if the film thickness (corresponding to the optical path length) associated with the intermirror distance changes approximately 5 nm (approximately 5% of the overall element film thickness), the peak wavelength may also change approximately 5 nm. For example, in the blue-color light emitting element in which the design value of the peak wavelength is set to 470 nm, if the film thickness increases 5 nm, the luminous efficiency at the shifted peak wavelength (for example, 475 nm) changes as much as 20% or more to cause a large luminance change and thus a reduction in image quality (luminance variations).

Specifically, since the cause of an image quality reduction (luminance variations) in the front direction lies in the relationship between the shift of the peak wavelength of the resonator output spectrum S2 and the relative luminous efficiency spectrum, the peak wavelength of the resonator output spectrum S2 is set to be located between the peak wavelength of the inner light emission spectrum S1 and the peak wavelength (that is, 555 nm for standard photopic vision) of the relative luminous efficiency spectrum in the present embodiment. With this setting, light emission output is reduced when the peak wavelength ($\lambda$S2) of the resonator output spectrum S2 is shifted toward higher levels of luminous efficiency due to manufacture errors, or conversely, light emission output is increased when the peak wavelength ($\lambda$S2) is shifted to lower levels of luminous efficiency, thereby allowing suppression of luminance variations in the front direction. It has been recognized from simulation that the luminance variations in the front direction for the blue color (B) were generally within ±5% when the peak wavelength ($\lambda$S2) of the resonator output spectrum S2 was shifted within the range of ±2 nm.

While the first and second reflecting members are formed of the reflecting electrode and the semi-transmitting electrode, respectively, in the light emitting elements shown in FIG. 1, the present embodiment is not limited thereto, and a reflecting film different from the electrode may be formed. In this case, an anode or a cathode closer to the reflecting film different from the electrode is preferably provided as a transparent electrode.

Embodiment 2

The present embodiment is a modification of Embodiment 1, and is an embodiment in which the light emitting element for the red color (R) is particularly used instead of the light emitting element for the blue color (B).

Figure 7:
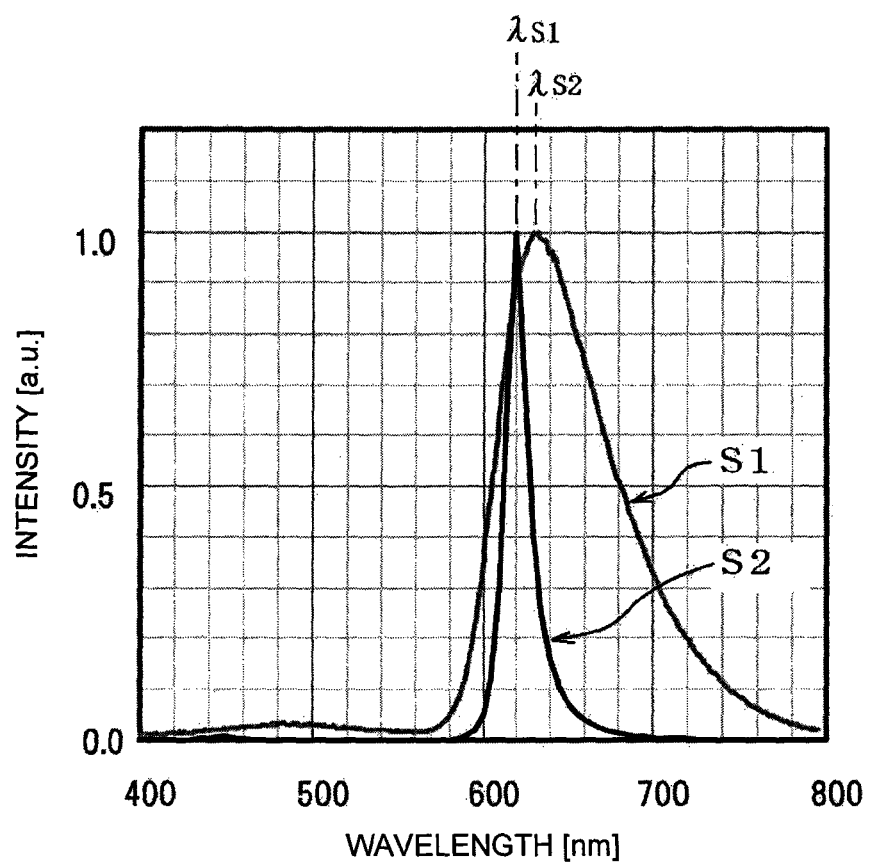
FIG. 7 A diagram showing optical spectra when a red color (R) is particularly used.

Specifically, as shown in FIG. 7, in the light emitting element for the red color (R), the peak wavelength ($\lambda$S2) of a resonator output spectrum S2 is set to be located between the peak wavelength ($\lambda S1$) of an inner light emission spectrum S1 and the peak wavelength (that is, 555 nm) of the relative luminous efficiency spectrum.

As described above, since the stacked film thickness (design value) of the organic layer 3 is determined to provide the resonator optical path length preferable for the red color (R) in the structure shown in FIG. 1, the peak wavelength (target value) of the resonator output spectrum S2 is accordingly determined. For example, when the resonator optical path length (design value) is set to 300 nm, the peak wavelength (target value) is 620 nm. The peak wavelength of the relative luminous efficiency spectrum is 555 nm for standard photopic vision. Thus, in the present embodiment, a light emitting material which provides the inner light emission spectrum S1 so as to establish the above-mentioned positional relationship between the spectra is selected from the light emitting materials described above as examples, and the selected light emitting material is used to form the light emission layer 33. It is preferable to use the light emitting material having the peak wavelength of the inner light emission spectrum S1 that falls within the range of 600 nm to 640 nm and having the peak wavelength of the resonator output spectrum S2 that is located toward shorter wavelengths relative to the peak wavelength of the inner light emission spectrum S1. In addition, the slope shape of the inner light emission spectrum S1 toward shorter wavelengths preferably has a shape generally proportional to the inverse of the slope of the relative luminous efficiency spectrum toward longer wavelengths. Especially for the red color (R), it is preferable that the peak wavelength of the resonator output spectrum S2 is located in the region in which the light emission intensity changes steeply in the leading edge of the inner light emission spectrum S1 toward shorter wavelengths.

In a more preferable example, for the same reasons as those in the simulation results of FIG. 4 and FIG. 5, a change rate $R_E$ of light emission intensity of the inner light emission spectrum S1 at the peak wavelength ($\lambda S2$) of the resonator output spectrum S2 is set to +0.03 [1/nm] or higher, preferably +0.05 [1/nm] or higher.

Figure 8:
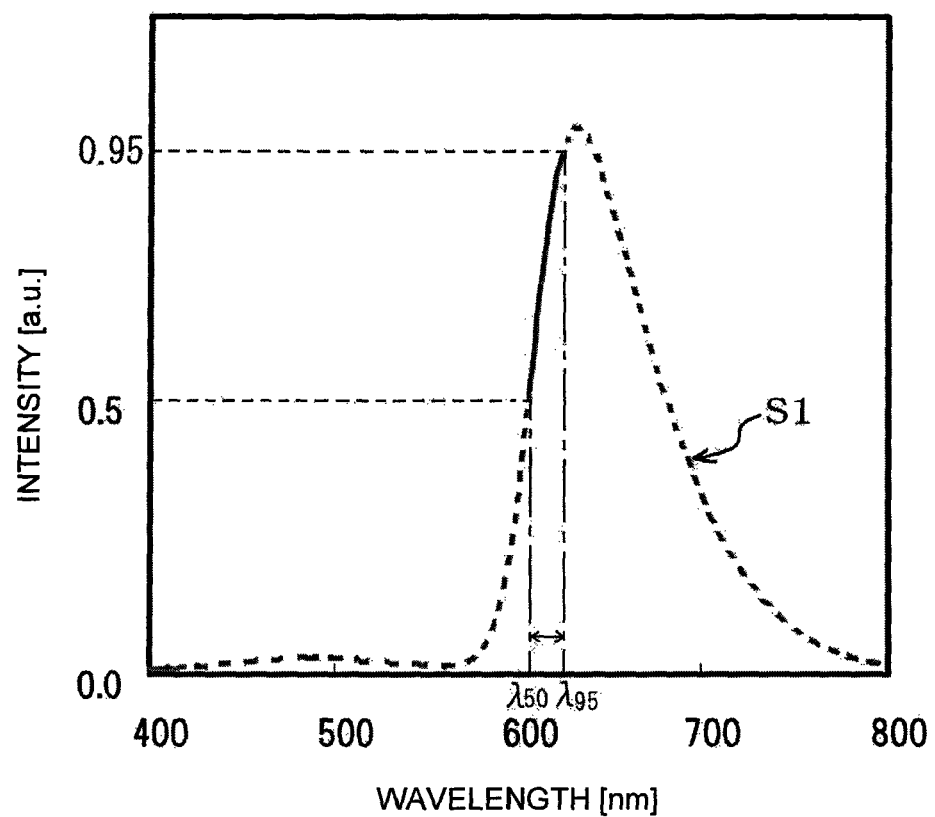
FIG. 8 A diagram showing an optical spectrum when the red color (R) is particularly used.

While the change rate $R_E$ of the light emission intensity of the inner light emission spectrum S1 at the peak wavelength $\lambda S2$ of the resonator output spectrum S2 preferably satisfies the abovementioned condition in the present embodiment, settings may be made to satisfy condition shown in FIG. 8 in addition to the change rate $R_E$ satisfying the abovementioned condition or instead of the change rate $R_E$ satisfying the abovementioned condition. Specifically, the peak wavelength $\lambda S2$ of the resonator output spectrum S2 is set to be located within the wavelengths ($\lambda 95$ to $\lambda 50$) corresponding to the range (the range indicated by a solid line in FIG. 8) of 95% to 50% of the highest value of the light emission intensity of the inner light emission spectrum S1 at the edge of the inner light emission spectrum S1 toward shorter wavelengths.

Similarly to the case of the blue color (B), to satisfy the abovementioned conditions, the abovementioned relationship may be achieved not only by performing the selection of the light emitting material but also by adjusting the peak wavelength (target value) of the resonator output spectrum S2 within a range in which acceptable color purity is provided, for example. The adjustment of the peak wavelength (target value) of the resonator output spectrum S2 can be performed by adjusting the film thickness (design value) of the organic layer 3. In addition, both of the selection of the light emitting material and the adjustment of the film thickness (design value) of the organic layer 3 may be performed to satisfy the abovementioned conditions.

Figure 9:
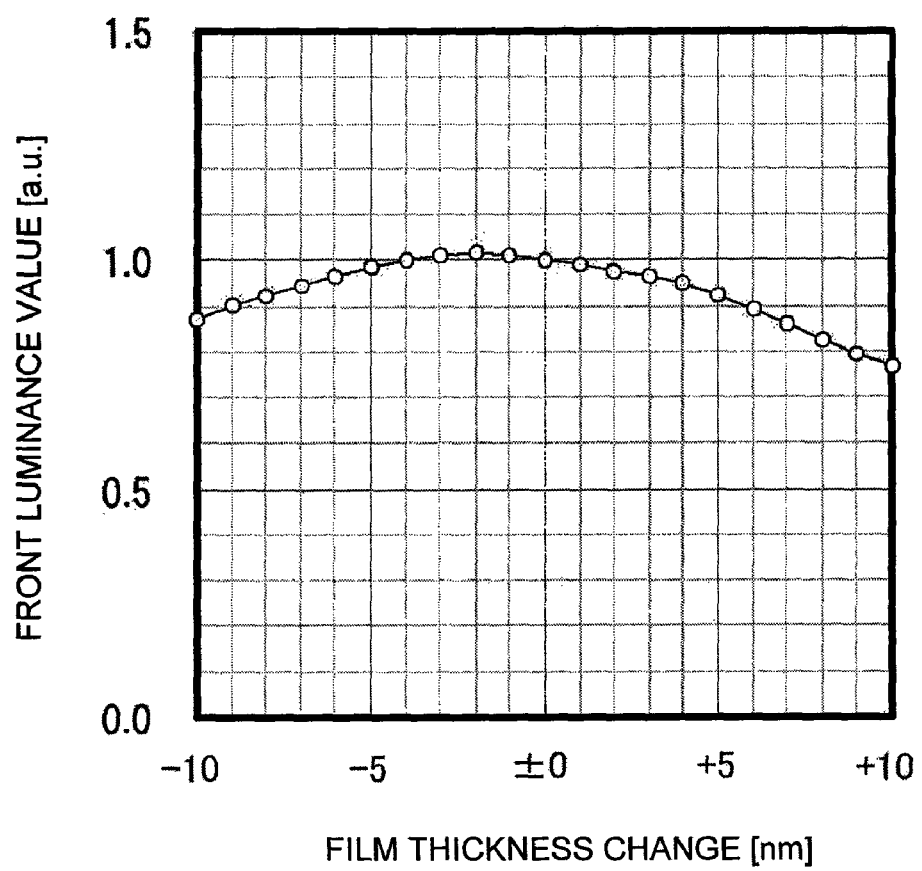
FIG. 9 A diagram showing the relationship between a film thickness change and a front luminance value when the red color (R) is particularly used.

In this manner, when the light emitting element for the red color (R) is particularly used, the peak wavelength of the resonator output spectrum S2 is also set to be located between the peak wavelength of the inner light emission spectrum S1 and the peak wavelength (that is, 555 nm for standard photopic vision) of the relative luminous efficiency spectrum. Thus, the light emission output is reduced when the peak wavelength ($\lambda S2$) of the resonator output spectrum S2 is shifted toward higher levels of luminous efficiency due to manufacture errors, or conversely, the light emission output is increased when the peak wavelength ($\lambda S2$) is shifted to lower levels of luminous efficiency, thereby allowing suppression of luminance variations in the front direction. It has been recognized from simulation that the luminance variations in the front direction for the red color (R) were within ±5% when the peak wavelength ($\lambda S2$) of the resonator output spectrum S2 was shifted within the range of ±2 nm as shown in FIG. 9.

Embodiment 3

The light emitting element for the blue color (B) is particularly used in Embodiment 1 and the light emitting element for the red color (R) is particularly used in Embodiment 2. However, in the display apparatus in which the display region is formed of a number of RGB light emitting elements, both of the light emitting elements for the blue color (B) and the red color (R) described in Embodiments 1 and 2 can be provided, and luminance variations can be suppressed in both of the blue color (B) and the red color (R).

Embodiment 4

Figure 10:
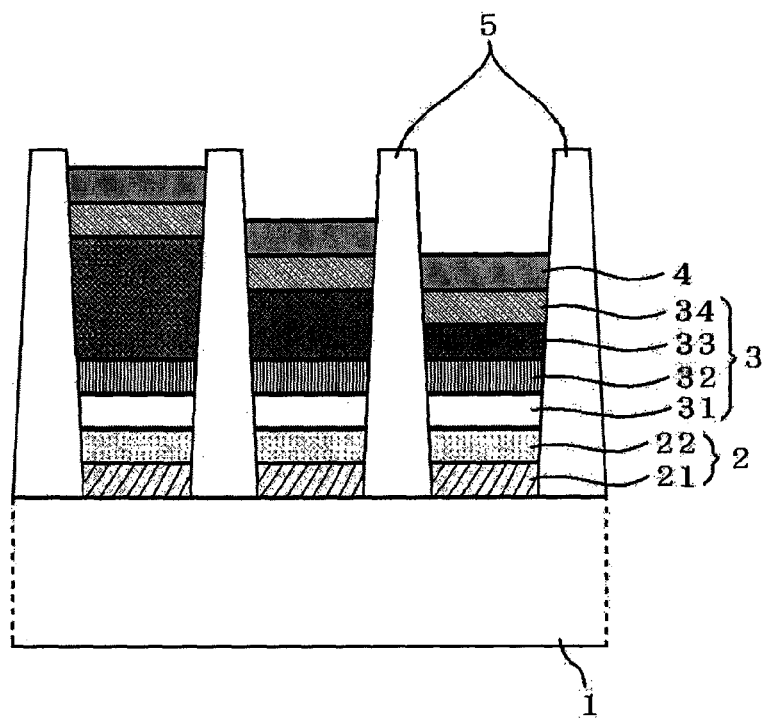
FIG. 10 A longitudinal section view of light emitting elements according to preferred Embodiment 4 of the present invention.

Embodiments 1 to 3 have shown the example in which the thickness of the hole injection layer 31 is changed to adjust the resonator optical path length for RGB. However, the present embodiment is not limited thereto, and the thickness of the light emission layer 33 may be changed to adjust the resonator optical path length as shown in FIG. 10.

Embodiment 5

Figure 11:
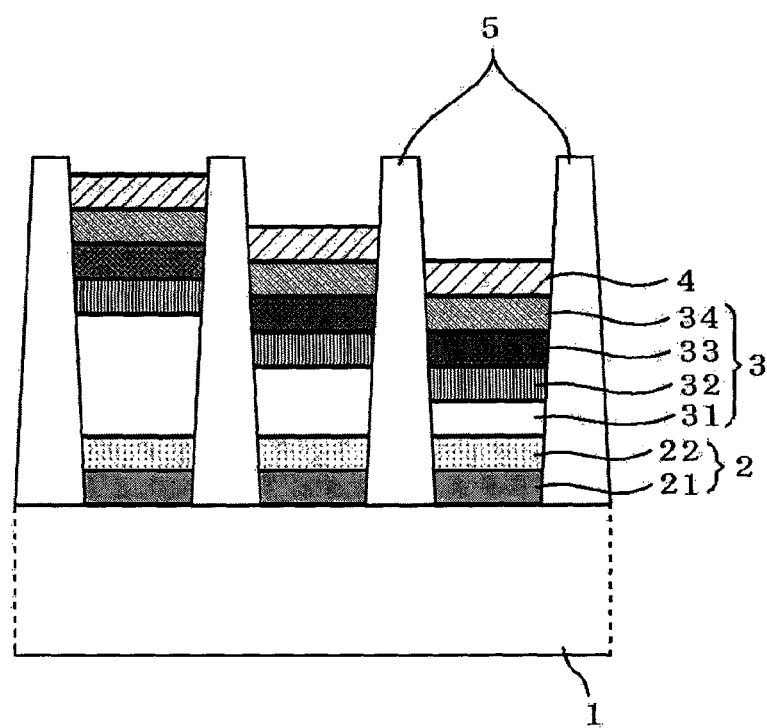
FIG. 11 A longitudinal section view of light emitting elements according to preferred Embodiment 5 of the present invention.

Embodiments 1 to 4 have described the light emitting elements of the top emission structure taken as an example. However, the present embodiment is not limited to this structure, and a bottom emission structure may be used as shown in FIG. 11. FIG. 11 shows an example in which the reflecting electrode 21 in FIG. 1 is formed as a semi-transmitting electrode and the cathode 4 is formed as a reflecting electrode to provide the bottom emission structure. However, the present embodiment is not limited to the structure in FIG. 1.

Embodiment 6

Next, an example of the procedure for manufacturing the RGB light emitting elements shown in FIG. 1 is described.

First, the reflecting electrode 21 and the transparent electrode 22 are deposited in order, for example by using a vapor deposition or a sputtering method. The patterning of the electrodes 21 and 22 can be performed with a photolithography method, for example. Then, a photosensitive resin containing a fluorine component is applied onto the substrate 1, dried and deposited, and then the division wall portion 5 having the pattern as shown in FIG. 1 is formed with the photolithography method, by way of example. For the passive type as an example, the electrodes 21 and 22 are formed into stripes, and then the division wall portion 5 is formed. On the other hand, for the active type as an example, after the electrodes 21 and 22 are formed into islands connected for each driving circuit, the division wall portion 5 is formed.

Next, the liquid material of the hole injection layer 31 is applied, for example with an inkjet nozzle, to the region defined by the division wall portion 5, and is dried and deposited. The hole transport layer 32 and the light emission layer 33 are also applied and deposited for each of the elements with the application method. The film thickness can be adjusted, for example by the application amount of the liquid material. Then, the electron transport layer 34 and the cathode 4 are formed in order with the evaporation method. The patterning of the cathode 4 can be performed by using a mask such as a metal mask or by utilizing the bank shape of the division wall portion 5. For the passive type as an example, the cathode 4 can be patterned in stripes. On the other hand, for the active type as an example, a so-called solid electrode can be used without performing patterning. With such a procedure, the RGB light emitting elements shown in FIGS. 1 and 2 can be manufactured.

As described above, according to Embodiments 1 to 6, the peak wavelength of the resonator output spectrum is set to be located between the peak wavelength of the inner light emission spectrum and the peak wavelength of the relative luminous efficiency spectrum to enable the suppression of luminance variations caused by nonuniformity of the resonator optical path length in the light emitting element having the resonator structure. In other words, since only small luminance variations occur even when the film thickness deviates from a design value, nonuniformity of the film thickness can be permitted to some extent, so that the yield can be improved and the cost can be reduced.

The technique according to the abovementioned embodiments can be applied not only to the organic thin-film light emitting element but also to an inorganic thin-film light emitting element having a stacked element structure (electroluminescence, light emitting diode). The technique is also applicable to a display apparatus of a light emission type in which light emitting elements are placed in an array on a plane. The structure may be formed such that emitted light is taken from both of the first and second reflecting members. In addition, the color is not limited to the three colors of RGB, but one color or two colors may be used, or another color may be included.

While the present invention has been described in detail in conjunction with the specific embodiments, it is apparent to those skilled in the art that various substitutions, modifications, changes and the like in forms and details may be made without departing from the spirit and scope of the present invention as specified by the claims. Thus, the scope of the present invention is not limited to the above embodiments and the accompanying drawings but should be defined on the basis of the claims and the equivalents thereof.

The invention claimed is:

1. A light emitting element comprising a resonator structure which has a first reflecting member, a second reflecting member, and a light emission layer placed between the first reflecting member and the second reflecting member, part of light resonated between the first reflecting member and the second reflecting member being transmitted through the first reflecting member or the second reflecting member in the resonator structure, wherein a wavelength at which a resonator output spectrum from the resonator structure has a maximum value is located between a wavelength at which an inner light emission spectrum of the light emission layer has a maximum value and a wavelength at which relative luminous efficiency has a maximum value.

2. The light emitting element according to claim 1, wherein the wavelength at which the inner light emission spectrum has the maximum value lies within a range of 450 nm to 480 nm, and wherein the wavelength at which the resonator output spectrum has the maximum value is located toward longer wavelength relative to the wavelength at which the inner light emission spectrum has the maximum value.

3. The light emitting element according to claim 2, wherein a change rate $R_E$ of light emission intensity of the inner light emission spectrum at the wavelength at which the resonator output spectrum has the maximum value is −0.03 or lower.

4. The light emitting element according to claim 3, wherein the change rate $R_E$ of the light emission intensity is −0.05 or lower.

5. The light emitting element according to claim 2, wherein a luminance variation in a front direction is within ±5% when the wavelength at which the resonator output spectrum has the maximum value is shifted within a range of ±2 nm.

6. The light emitting element according to claim 1, wherein the wavelength at which the inner light emission spectrum has the maximum value lies within a range of 600 nm to 640 nm, and wherein the wavelength at which the resonator output spectrum has the maximum value is located toward shorter wavelength relative to the wavelength at which the inner light emission spectrum has the maximum value.

7. The light emitting element according to claim 6, wherein a change rate $R_E$ of light emission intensity of the inner light emission spectrum at the wavelength at which the resonator output spectrum has the maximum value is +0.03 or higher.

8. The light emitting element according to claim 7, wherein the change rate $R_E$ of the light emission intensity is +0.05 or higher.

9. The light emitting element according to claim 6, wherein a luminance variation in a front direction is within ±5% when the wavelength at which the resonator output spectrum has the maximum value is shifted within a range of ±2 nm.

10. A display apparatus comprising a number of resonator structures, each of the resonator structures having a first reflecting member, a second reflecting member, and a light emission layer placed between the first reflecting member and the second reflecting member, part of light resonated between the first reflecting member and the second reflecting member being transmitted through the first reflecting member or the second reflecting member in the resonator structure, wherein a wavelength at which a resonator output spectrum from the resonator structure has a maximum value is located between a wavelength at which an inner light emission spectrum of the light emission layer has a maximum value and a wavelength at which relative luminous efficiency has a maximum value.

* * * * *